Figure 1:
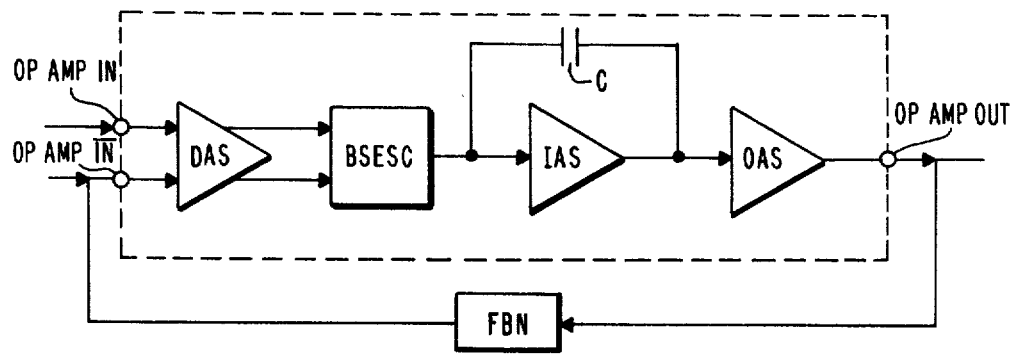

United States Patent [19]

Wheatley, Jr.

[11] 4,254,381
[45] Mar. 3, 1981

[54] BALANCED-TO-SINGLE-ENDED SIGNAL CONVERTERS

[75] Inventor: Carl F. Wheatley, Jr., Somerset, N.J.

[73] Assignee: RCA Corporation, New York, N.Y.

[21] Appl. No.: 27,517

[22] Filed: Apr. 5, 1979

[51] Int. Cl.³ .............................................. H03F 3/04
[52] U.S. Cl. ................................. 330/301; 330/252; 330/255
[58] Field of Search ............... 330/70, 71, 116, 252, 330/255, 275, 301

[56] References Cited

U.S. PATENT DOCUMENTS

| | | | |
|---|---|---|---|
| 3,573,645 | 4/1971 | Wheatley, Jr. | 330/273 |
| 3,757,138 | 9/1973 | Bhatia et al. | 330/255 X |
| 3,886,466 | 5/1975 | Wheatley, Jr. | 330/272 |
| 4,004,240 | 1/1977 | Crowle | 330/301 X |
| 4,109,214 | 8/1978 | Main | 330/301 X |
| 4,164,716 | 8/1979 | Dague et al. | 330/255 X |

*Primary Examiner*—James B. Mullins
*Attorney, Agent, or Firm*—E. M. Whitacre; P. J. Rasmussen; Allen LeRoy Limberg

[57] ABSTRACT

A balanced-to-single-ended signal converter includes a pair of transistors of the same conductivity type responsive to balanced signals applied to their respective base electrodes to provide a single-ended signal at the interconnection of their serially connected collector-to-emitter paths.

25 Claims, 9 Drawing Figures

BALANCED-TO-SINGLE-ENDED SIGNAL CONVERTERS

The present invention relates to balanced-to-single-ended signal converters (BSESC's) suitable for construction in monolithic integrated circuit form.

Integrated BSESC's often take the form of current mirror amplifiers (CMA's) with minus unity current gain. These CMA's typically comprise matched master and slave current mirroring transistors of bipolar type. The master transistor is provided with direct coupled collector-to-base feedback to adjust its emitter-to-base potential for conditioning its collector-to-emitter path to conduct essentially all of an inverting-input current. The emitter-to-base potential of the master mirroring transistor is applied as the emitter-to-base potential of the slave mirroring transistor to condition its collector-to-emitter path to demand a current similar to the inverting-input current, which demand is subtracted from a non-inverting-input current to yield a single-ended output current. The common-mode signal rejection of the balanced-to-single-ended signal conversion relies upon the matching of the collector current versus emitter-to-base voltage characteristics of the master and slave mirroring transistors.

Unfortunately, this matching is sharply affected by differences in the temperatures of the mirroring transistors. For one degree Kelvin (1° C.) of difference between their emitter-base junction operating temperatures, the collector currents of matched silicon mirroring transistors will differ by 8 to 9%, if their base-emitter potentials are made equal. In monolithic integrated circuits experiencing steep on-chip thermal gradients, such as circuits having output stages delivering watts of power, such differences in operating temperature between adjacent transistors are likely to occur. Further, because the thermal gradients change appreciably at audio frequency rates in many integrated circuits, it is difficult or impossible to overcome mismatch, caused by temperature differences between the transistors, by introducing a compensating mismatch by other means—e.g., by scaling their respective effective emitter-base junction areas.

For one Kelvin of difference between their emitter-base junction operating temperatures the collector currents of matched silicon mirroring transistors will differ only 0.7%, if their base currents are made equal. This suggested to the present inventor the desirability of using BSESC's relying solely on the matching of the comon-emitter forward current gains ($h_{fe}$'s) of a pair of transistors in place of CMA's in balanced-to-single-ended conversion applications.

A BSESC constructed in accordance with the present invention includes a pair of transistors of the same conductivity type responsive to balanced signals applied to their respective base electrodes to provide a single-ended signal at the interconnection of their serially connected collector-to-emitter paths.

Figure 2:
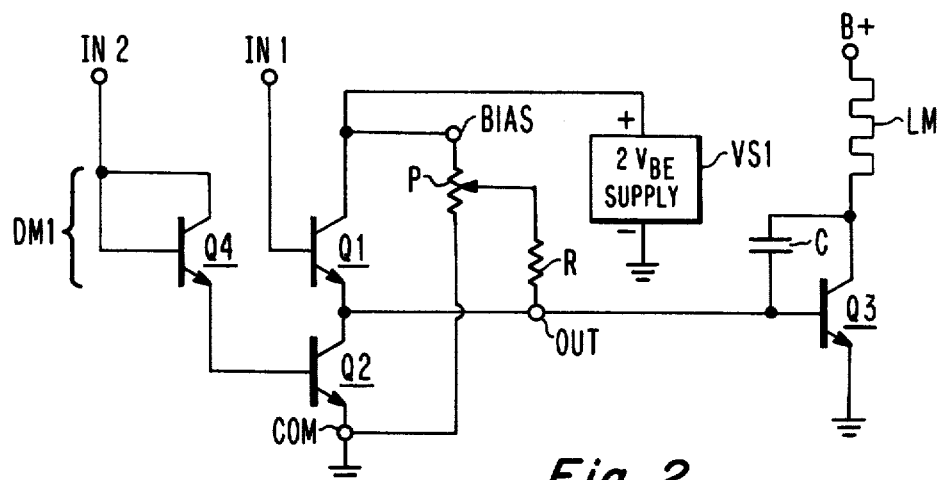
Figure 6:
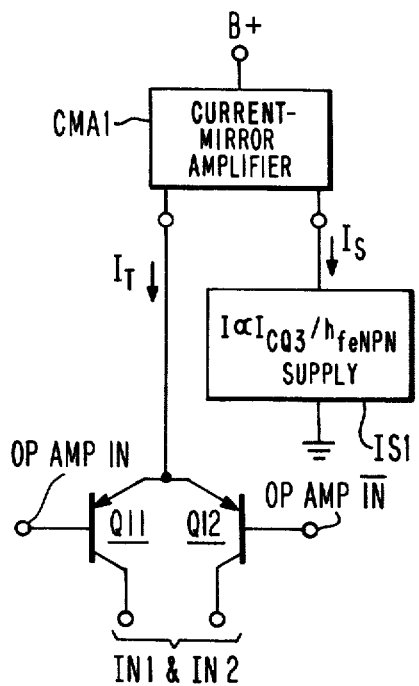
Figure 7:
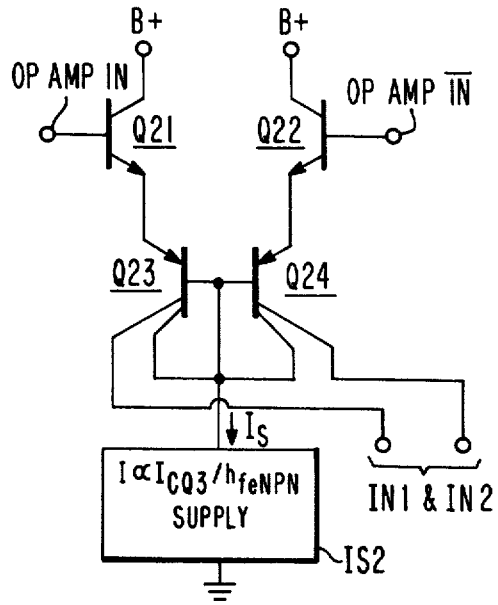
Figure 8:
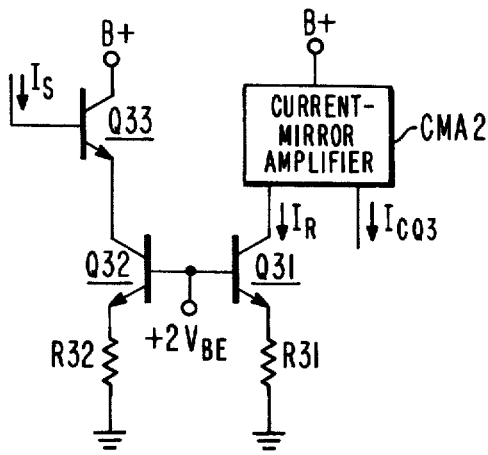
Figure 9:
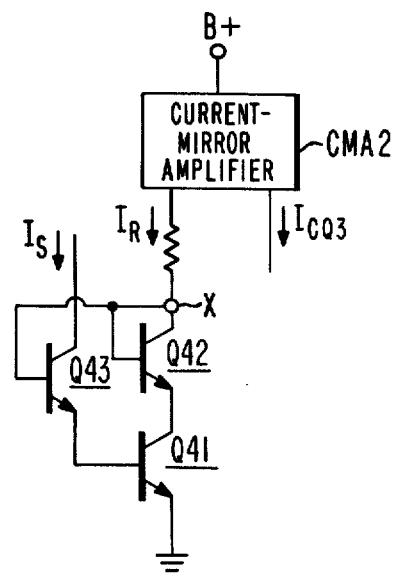

In the drawing:

FIG. 1 is a block schematic diagram of a conventional power operational amplifier; and each of FIGS. 2, 3, 4 and 5 is a schematic diagram of a balanced-to-single-ended signal converter constructed in accordance with the present invention;

each of FIGS. 6 and 7 is a schematic diagram of a differential amplifier and bias circuit particularly well suited for operation with a balanced-to-single-ended signal converter as shown in FIG. 2 in furtherance of the present invention, and each of FIGS. 8 and 9 is a schematic diagram of a current supply suitable for use in the bias circuit of FIG. 6 or 7.

The power operational amplifier of FIG. 1, enclosed within a dashed-line rectangle symbolic of its being constructed within the confines of a monolithic integrated circuit, has non-inverting and inverting input terminals OP AMP IN and OP AMP $\overline{\text{IN}}$ for applying signals to an initial differential amplifier stage DAS. The balanced output currents from this differential amplifier stage are supplied to a balanced-to-single-ended signal converter BSESC for conversion to single-ended form. This single-ended signal is applied to an intermediate amplifier stage IAS which includes means for establishing the dominant 6 dB per octave roll-off in open-loop frequency response typical of an operational amplifier. This means is shown in FIG. 1 as comprising an on-chip Miller integrating capacitor C, although an off-chip capacitor may be used instead and the integration may be done in other ways. The amplified and rolled-off signal from intermediate amplifier stage IAS is applied as input signal to an output, or power, amplifier stage OAS which responds to supply the amplified output signal appearing at the output terminal OP AMP OUT of the operational amplifier.

In operation, the output terminal OP AMP OUT of the operational amplifier is normally direct-coupled to its inverting input terminal OP AMP $\overline{\text{IN}}$ via a feedback network FBN, as shown in FIG. 1, to complete an overall degenerative feedback loop to arrange for the voltage at terminal OP AMP OUT to have a prescribed value (usually midway between relatively positive and relatively negative operating potentials) when the input voltages at terminals IN and $\overline{\text{IN}}$ are alike. This overall feedback establishes quiescent operating conditions on all stages of the amplifier; and, assuming the intermediate amplifier stage IAS to include a transconductive or voltage amplifying device, establishes a quiescent potential across the input circuit of that stage and, thus, across the BSESC output circuit. As noted above, in the prior art a current mirror amplifier with minus unity current gain is usually used for the balanced-to-single-ended signal converter BSESC.

FIG. 2 shows a BSESC having first and second input connections IN1 and IN2 for receiving respective balanced input signals—e.g., from a preceding differential amplifier stage—that are applied as base currents to NPN transistors Q1 and Q2, respectively. The emitter of Q2 is connected via a common terminal COM to a point of reference potential, shown here as ground, which reference potential is normally the relatively negative operating supply potential for the operational amplifier. In cases where the operational amplifier is not operated with a single supply but with positive and negative operating voltage supplies, this reference potential would normally be the negative operating voltage. Q1 and Q2 have similar common emitter forward current gains $h_{feNPN}$, and their collector-to-emitter paths are serially connected between the common terminal COM and a bias terminal BIAS to receive a bias potential, as will be more particularly described below. The interconnection of their collector-to-emitter paths connects to the output terminal OUT of the BSESC.

Common-emitter amplifier transistor Q3 is an NPN transistor in the intermediate amplifier stage IAS receiving an operating voltage at its collector electrode and being arranged to work into a collector load LM to develop the amplified and rolled-off signal to be applied to the output amplifier stage OAS. (In FIGS. 2-5 the resistor LM and B+ voltage represent the collector load and operating voltage, respectively. Another type of collector load—e.g., a constant current generator—may be used instead.) The overall feedback of the operational amplifier will regulate the emitter-to-base potential $V_{BEQ3}$ of Q3 to a quiescent value that establishes the potential at terminal OUT. This potential is quiescent emitter-to-collector potential $V_{CEQ2}$ of Q2.

Particularly in critical applications, it is desirable that Q2 have a quiescent emitter-to-collector potential $V_{CEQ1}$ that is substantially equal to $V_{CEQ2}$, so that the self-heating of Q2 is the same as the self-heating of Q1. This is in line with the desire to keep the operating potentials of Q1 and Q2 as nearly alike as possible. So, it is preferred to use a bias supply VS1 applying a potential $2V_{BEQ3}$ between terminals COM and BIAS. This provides Q1 a collector potential that conditions it to operate in the normal mode of transistor operation. Q2 is conditioned to operate in the normal mode of transistor operation by $V_{BEQ3}$ being applied to its collector electrode.

Responsive to input current flow therethrough, terminal IN1 will be at a quiescent input potential $V_{IN1}$ that is equal to $V_{BEQ3}+V_{BEQ1}$, $V_{BEQ1}$ being the offset potential across the emitter-base junction of Q1. It is desirable to make the quiescent input potential $V_{IN2}$ at terminal IN2 substantially equal to $V_{IN1}$ so as to present the same voltages to each half of the differential amplifier stage DAS. This matches the portions of their output current versus input voltage characteristics that the transistors in each half of this earlier stage operate on, and so reduces input offset voltage error—i.e., the static difference in potential between terminals OP AMP IN and OP AMP $\overline{\text{IN}}$ of the operational amplifier. Accordingly, an NPN transistor Q4 self-biased by collector-to-base connection to form a diode means DM1 is inserted between terminal IN2 and the base of Q2, poled for simultaneous conduction with the base-emitter junction of Q2. The respective emitter-to-base potentials $V_{BEQ2}$ and $V_{BEQ4}$ of Q2 and Q4 sum to make $V_{IN2}$ equal to $V_{BEQ2}+V_{BEQ4}$, which substantially equals $V_{BEQ3}+V_{BEQ1}$.

There may be an undesirable residual unbalance between the emitter current of Q1 and the collector current of Q2, that is not exactly that required by Q3 as quiescent base current to maintain its quiescent collector current at nominal value. If no way were provided to offset this residual unbalance, the overall feedback of the operational amplifier would correct it, undesirably providing an input offset error between its input terminals OP AMP IN and OP AMP $\overline{\text{IN}}$. A potentiometer P with end connections to terminals COM and BIAS and an adjustable tap connection connected via the relatively-high-resistance resistor R to terminal OUT provides for correcting this residual unbalance while nulling the input offset error.

During operation of the FIG. 2 BSESC, increase of the current supplied to terminal IN1 and decrease of the current supplied to terminal IN2 will increase the conduction of Q1 vis-a-vis the conduction of Q2. The emitter current of Q1 increases respective to the collector current of Q2, increasing the base current drive to Q3. On the other hand, increase of the current supplied to terminal IN2 and decrease of the current supplied to IN1 will increase the conduction of Q2 vis-a-vis that of Q1. The collector current of Q1 will increase respective to the emitter current of Q2, decreasing the base current drive to Q3—indeed, shutting it off entirely and charging capacitor C under fast-slewing conditions.

It is worthy to note that while a current mirror amplifier used as a BSESC offers no current gain, the FIG. 2 BSESC offers a current gain of $h_{feNPN}$. For normal integrated circuit NPN's this current gain is from 30 to 100 times. Further, since the transistors Q1 and Q2 operate with emitter-to-collector voltages of only a $V_{BE}$ there exists the possibility of making them super-beta types in which $h_{feNPN}$ ranges up to 1000 or so.

Figure 3:
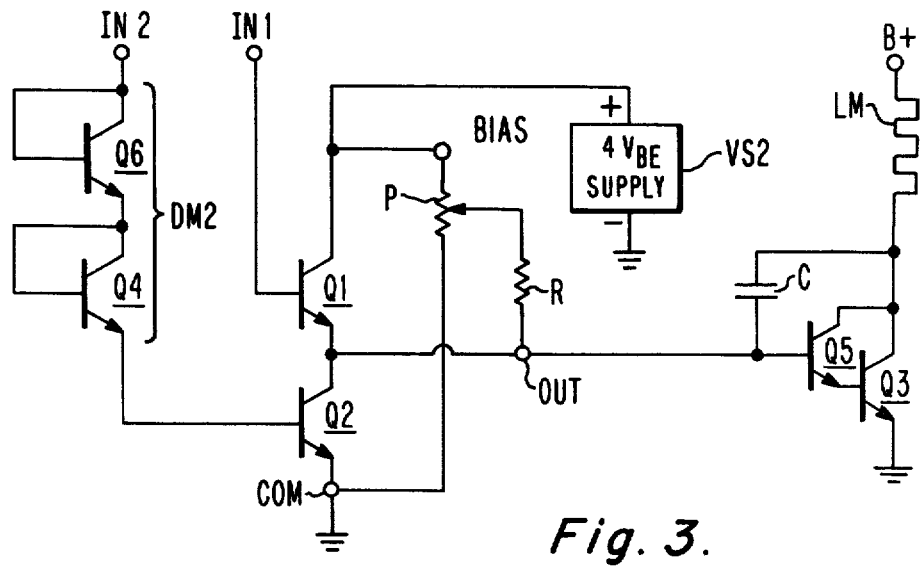

FIG. 3 shows how the BSESC is modified when the current gain of Q3 is increased by preceding it in a direct-coupled cascade connection—e.g., the Darlington cascade connection—with another NPN transistor Q5. The quiescent potential at terminal OUT is regulated by the overall feedback of the operational amplifier to $V_{BEQ3}+V_{BEQ5}$, where $V_{BEQ5}$ is the quiescent emitter-to-base potential of Q5. Bias supply VS1 applying a $+2V_{BE}$ potential to terminal BIAS is replaced by bias supply VS2 applying a $+4V_{BE}$ potential to terminal BIAS. This is done to make $V_{CEQ1}$ substantially the same as $V_{CEQ2}$, so the self-heating of Q1 is substantially the same as the self-heating of Q2. Terminal IN1 is at a quiescent potential of $V_{BEQ3}+V_{BEQ5}+V_{BEQ1}$. The quiescent potential at terminal IN2 is made to be substantially equal to this $+3V_{BE}$ potential by replacing diode means DM1 with diode means DM2 providing a $+2V_{BE}$ offset between the base of Q2 and terminal IN 2. Diode means DM 2 includes, besides diode-connected NPN transistor Q4, another diode-connected NPN transistor Q6 in series connection therewith.

Figure 4:
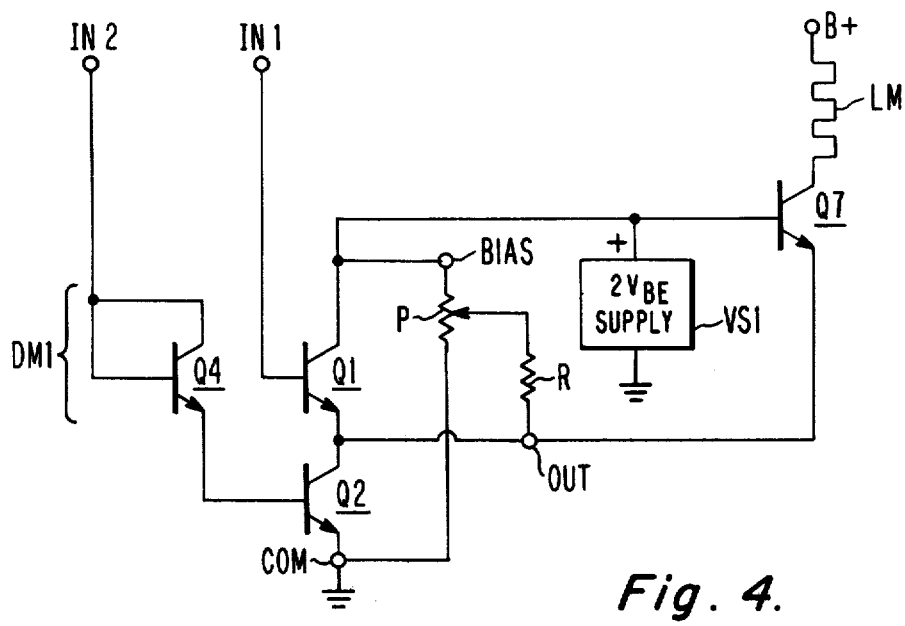
Figure 5:
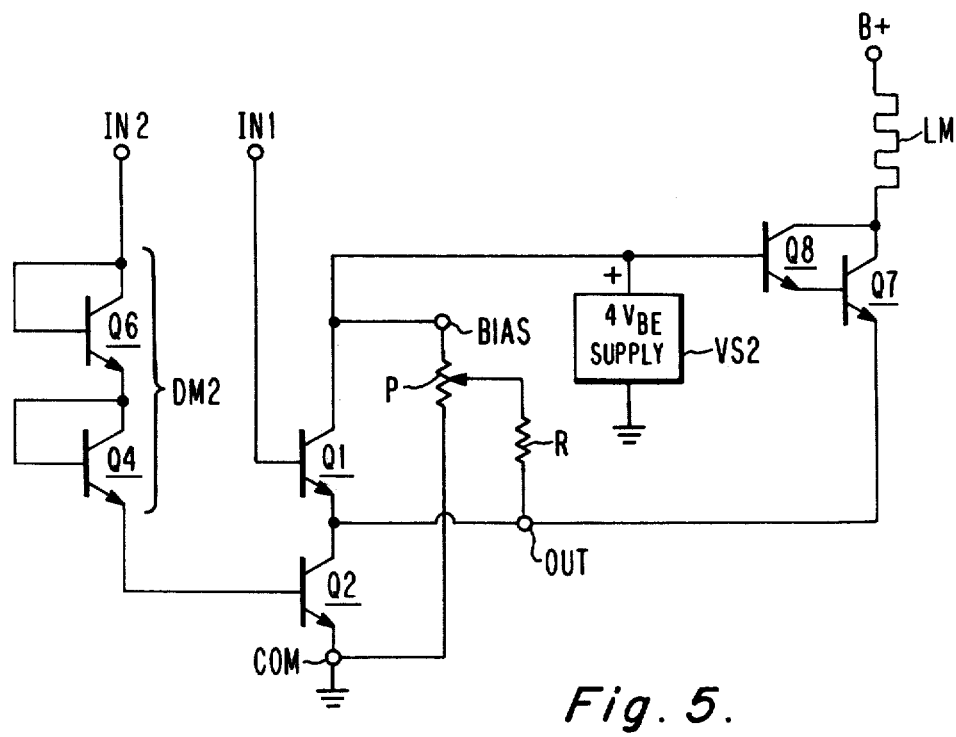

FIG. 4 shows the BSESC of FIG. 2 may be used to drive a common-base amplifier NPN transistor Q7. Analogously, FIG. 5 shows how the BSESC of FIG. 3 may be used to drive a Darlington connection of NPN transistors Q7 and Q8 at the emitter of Q7. These connections are less favored. Not only does one lose the current gains of the transistors driven by the BSESC. One must use potentiometer P to adjust for the appreciable emitter current of Q7, since that emitter current flows in a direction opposite to the flow of the natural excess of the quiescent emitter current $I_{EQ1}$ of Q1 over the quiescent collector current $I_{CQ2}$ of Q2. This comes about because of the common-collector forward current gains of transistors being larger by unity than their common-emitter forward current gains. Of course, this may be compensated for by constant current generator means being connected between the terminal COM and the emitter of Q7, although this refinement is not shown in FIGS. 4 and 5.

FIG. 6 shows a form the differential amplifier stage DAS preceding the BSESC of FIG. 2 may take. PNP transistors Q11 and Q12 are connected in long-tailed pair configuration, the interconnection of their emitter electrodes receiving tail current $I_T$ from the output circuit of a current mirror amplifier CMA1. The base electrodes of Q11 and Q12 are at the OP AMP IN and OP AMP $\overline{\text{IN}}$ terminals, respectively, and their collector electrodes connect to separate ones of the IN1 and IN2 input connections of the FIG. 2 BSESC. The current mirror amplifier CMA1 has its input circuit connected to a current supply IS1 of a type that withdraws a current $I_S$ proportional to the quiescent collector current $I_{CQ3}$ of Q3 (shown in FIG. 2) divided by $h_{feNPN}$. By choosing the constant of proportionality and the current gain of current-mirror amplifier CMA1 appropriately, the natural excess of $I_{EQ1}$ over $I_{CQ2}$ will tend to satisfy exactly the base current requirement of Q3.

FIG. 7 shows another operational amplifier input stage also suited to conditioning the FIG. 2 BSESC for tending to satisfy exactly the base current requirement of Q3. NPN emitter-follower transistors Q21 and Q22 couple terminals OP AMP IN and OP AMP $\overline{\text{IN}}$ to the emitters of plural-collector PNP transistors Q23 and Q24, respectively. First ones of the collector electrodes of Q23 and Q24 connect to separate ones of the input connections IN1 and IN2 of the FIG. 2 BSESC; second ones of the collector electrodes of Q23 and Q24 connect to their respective base electrodes, connecting Q23 and Q24 as respective current mirror amplifiers. A current supply IS2 demands a current $I_S$ proportional to $I_{CQ3}/h_{feNPN}$, which demand is satisfied in equal measures from the interconnected input circuits of these current mirror amplifiers. The output circuits of these current mirror amplifiers between the emitter and first collector electrodes of Q23 and Q24 supply similar quiescent currents, each proportional to $I_{CQ3}/h_{feNPN}$ to the input connections IN1 and IN2 of the FIG. 2 BSESC.

FIG. 8 shows one type of apparatus for generating $I_{CQ3}$ to provide a constant current generator collector load for Q3, and an $I_S$ proportional to $I_{CQ3}/h_{feNPN}$. A current mirror amplifier CMA2 supplies $I_{CQ3}$ from its output circuit responsive to a current $I_R$ withdrawn from its input circuit. In FIG. 8 $I_R$ is equal to the collector current demand $I_{CQ31}$ of an NPN transistor Q31. It and NPN transistor Q32 receive the same base bias voltage—e.g., $2V_{BE}$— and have similar emitter potentials by virtue of their respective emitter-follower actions. Q31 and Q32 are provided with respective emitter degeneration resistors R31 and R32, and their respective emitter currents will be in the same ratio as the conductances of their respective emitter degeneration resistors, in accordance with Ohm's Law. Thus, too, their collector currents $I_{CQ31}$ and $I_{CQ32}$, assuming their base currents to be negligible, in accordance with Kirchoff's Law of Currents. $I_{CQ32}$, which then is proportional to $I_R$ and thus to $I_{CQ3}$, is withdrawn as emitter current from NPN transistor Q33, causing a base current flowing as $I_S$ that is $(h_{feNPN}+1)$ times smaller. This closely approximates an $I_S$ that is proportional to $I_{CQ3}/h_{feNPN}$ since $h_{feNPN}$ is normally many times greater than unity.

FIG. 9 shows another type of apparatus for generating $I_{CQ3}$ and $I_S$. NPN transistor Q41 is provided direct coupled collector-to-base feedback via diode-connected NPN transistor Q42 in its collector current path and the emitter-follower action of an NPN transistor Q43 that conducts its base current. This feedback constrains the potential at the end of resistor 41, connected to point X in the collector circuit of Q41, to which the base of Q43 also connects, to be equal to $V_{BEQ41}+V_{BEQ43}$, the sum of the respective emitter-to-base offset potentials of Q41 and Q43. $I_R$ will flow in accordance with Ohm's Law through R41 which connects the input circuit of CMA2 to point X, and thence in largest part through diode-connected Q42 to the collector of Q41 to flow as the collector current $I_{CQ41}$ of Q41. $I_{CQ41}$, being substantially equal to $I_R$, will thus be proportional to $I_{CQ3}$; and the base current $I_{BQ41}$, being equal to $I_{CQ41}/h_{feNPN}$, will be proportional to $I_{CQ3}/h_{feNPN}$. This base current gives rise by the common-base-amplifier action of Q43 to an $I_S$ substantially equal to itself and thus proportional to $I_{CQ3}/h_{feNPN}$. The diode-connected Q42 reduces the emitter-to-collector voltage of Q42 to substantially equal its emitter-to-base voltage, permitting Q41 to be of super-beta type together with Q1 and Q2.

One skilled in the art and armed with the foregoing disclosure will be able to generate other embodiments of the present invention, and this should be borne in mind when construing the scope of the following claims. Constant current generating means are current generating means supplying currents at sufficiently high source impedance, that the values of these currents, are substantially unaffected by changes in the impedance of the load they supply or to changes in potential across that load. The generated currents may, however, be changing signal currents, as, for example, the collector currents supplied by Q11 and Q12 in FIG. 6.

What is claimed is:

1. In combination:

a point of reference potential;

a point of bias potential;

a point of operating potential;

first, second and third nodes;

means for supplying first and second currents at said first node and at said second node, respectively, said first and second currents being essentially unidirectional currents with equal respective common-mode components of like polarity and with equal respective differential-mode components of opposite polarity;

a balanced-to-single-ended converter connected to differentially combine the first and second currents supplied at first and second nodes, including first and second transistors of the same conductivity type, having respective base electrodes to which said first and second nodes respectively connect, for respectively receiving said first current and said second current, having respective emitter electrodes respectively connected to said third node and to said point of reference potential, having respective collector electrodes respectively connected to said point of bias potential and to said third node, and exhibiting substantially equal base-to-collector current gains, said first transistor thereby providing a current gain between said first and third nodes which substantially equals one plus the current gain concurrently provided between said second and third nodes by said second transistor;

a third transistor of the same conductivity type as said first and second transistors having an emitter electrode connected without substantial voltage offset to said point of reference potential, having a base electrode to which the voltage at said third node is applied without translation, and having a collector electrode; and collector load means to which the collector electrode of said third transistor connects, having a path for direct current therethrough connecting the collector electrode of said third transistor and said point of operating potential.

2. A combination as set forth in claim 1 with said balanced-to-single-ended signal converter also including:

a direct connection without substantial intervening impedance of said first node to the base electrode of said first transistor; and potential offsetting means between said second node and the base electrode of said second transistor responsive to the quiescent level of said second current to offset the potential at said second node from that at the base electrode of said second transistor an amount substantially equal to the quiescent emitter-to-base offset potential of said third transistor, for making the quiescent levels of potential at said first and second nodes/substantially equal when said first and second currents are at their quiescent levels.

3. A combination as set forth in claim 1 or 2 including:
means for regulating the difference between said reference and bias potentials to a value/essentially twice the quiescent emitter-to-base offset potential of said third transistor.

4. A balanced-to-single-ended signal converter comprising:
an output terminal for signal;
a pair of input terminals for signal, the first and second of which are non-inverting and inverting input signal terminals, respectively, respective to said output terminal for signal;
a common terminal for signal and a bias terminal;
a first transistor with a base electrode connected at said first input terminal for signal, an emitter electrode connected at said output terminal for signal, and a collector electrode connected at said bias terminal;
a second transistor of the same conductivity type as said first transistor and with a base electrode, an emitter electrode connected at said common terminal, and a collector electrode connected at said output terminal for signal;
a number of semiconductor diode means connected in a path between said second input terminal for signal and the base electrode of said second transistor and poled for forward conduction of base current to said second transistor, for introducing an offset potential between the base electrode of said second transistor and said second input terminal for signal; and
means for applying a potential substantially twice said offset potential between said common and bias terminals.

5. A balanced-to-single-ended signal converter as set forth in claim 4, wherein only one semiconductor diode means is connected in the path between said second input terminal for signal and the base electrode of said second transistor, in combination with:
a common-emitter-amplifier transistor having an emitter-base junction connected between the common and output terminals for signal of said balanced-to-single-ended signal converter and having a collector electrode for connection to receive operating potential and to drive a load means.

6. A balanced-to-single-ended signal converter as set forth in claim 4, wherein only one semiconductor diode means is connected in the path between said second input terminal for signal and the base electrode of said second transistor, in combination with:
a common-base-amplifier transistor having an emitter-base junction connected between the bias terminal and the output terminal for signal of said balanced-to-single-ended signal converter and having a collector electrode for connection to receive operating potential and to drive a load means.

7. A balanced-to-single-ended signal converter as set forth in claim 4, wherein only a pair of semiconductor diode means in series connection with each other is connected in the path between said second input signal for signal and the base electrode of said second transistor, in combination with:
a pair of further amplifier transistors having respective emitter-base junctions in series connection between said output terminal for signal and said common terminal for signal and having respective collector electrodes for connection to receive operating potential with the collector electrode of at least one of them arranged to drive load means.

8. A balanced-to-single-ended signal converter as set forth in claim 4, wherein only a pair of semiconductor diode means in series connection with each other is connected in the path between said second input signal for signal and the base electrode of said second transistor, in combination with:
a pair of further amplifier transistors having respective emitter-base junctions in series connection between said bias terminal for signal and said output terminal for signal and having respective collector electrodes for connection to receive operating potential with the collector electrode of at least one of them arranged to drive load means.

9. A combination as set forth in claim 5, 6, 7 or 8 further including:
a potentiometer with a resistive body between first and second end connections at said common terminal for signal and at said bias terminal, respectively, and with an adjustable tap connection galvanically connected to said output terminal for signal.

10. In combination:
a differential-input-differential-output amplifier, responsive to the common-mode component of input potentials respectively applied to its first and second input connections for respectively supplying equal common-mode components of output current at its first and second output connections, and responsive to the differential-mode component of or difference between input potentials respectively applied to its first and second input connections for respectively supplying balanced differential-mode-components of output current at its first and second output connections;
first and second transistors of a first conductivity type, having respective base and emitter and collector electrodes, the first output connection of said differential-input-differential-output amplifier being at the base electrode of said first transistor, and the collector electrode of said second transistor being connected to the emitter electrode of said first transistor;
means for applying a reference potential at the emitter electrode of said second transistor;
means for applying a biasing potential at the collector electrode of said first transistor;
means for maintaining a difference between the quiescent emitter potentials of said first and second transistors, including
further amplifier circuitry having an input circuit connected between the emitter electrodes of said first and second transistors and having an output circuit direct coupled to the circuit between the input connections of said differential-input-differential-output amplifier to complete a degenerative feedback loop;
third and fourth transistors of a second conductivity type complementary to said first conductivity type, each having respective input and first output and common electrodes and being included in said differential-input-differential-output amplifier, the first and second input connections of said differential-input-differential-output amplifier being respectively to the input electrode of said third transistor and to the input electrode of said fourth transistor, the first output electrodes of said third and fourth transistors being respectively connected at the first output connection of said differential-input-differential-output amplifier and at its second output connection, and the common electrodes of said third and fourth transistors being maintained at similar potential; and means for maintaining the quiescent potentials at the first and second output connections of said differential-input-differential-output amplifier substantially the same, including means for offsetting the potential at the second output connection of said differential-input-differential-output amplifier from the base potential of said second transistor by an amount substantially equal to said difference between the quiescent emitter potentials of said first and second transistors.

11. A combination as set forth in claim 10 wherein said further amplifier circuitry includes a common-emitter-amplifier transistor of said first conductivity type, with base electrode connected at the emitter electrode of said first transistor, and with emitter electrode connected at the emitter electrode of said second transistor; and wherein said means for offsetting the potential at the second output connection of the differential-input-differential-output amplifier from the base potential of said second transistor is a single semiconductor diode means connected from that second output connection to the base electrode of said second transistor and poled for forward conduction of output current through that second output connection.

12. A combination as set forth in claim 11 wherein said means for applying a biasing potential consists of means for applying a potential twice as large as the emitter-to-base offset potential of said common-emitter-amplifier transistor between the emitter electrode of said second transistor and the collector electrode of said first transistor.

13. A combination as set forth in claim 10 wherein said further amplifier circuitry includes fifth and sixth transistors of said first conductivity type having respective base and emitter and collector electrodes, the base electrodes of said fifth and sixth transistors being respectively connected at the emitter electrode of said first transistor and at the emitter electrode of said fifth transistor, the emitter electrode of said sixth transistor being connected at the emitter electrode of said second transistor, and the collector electrodes of said fifth and sixth transistors being connected to receive operating potential, at least one receiving its operating potential via load means; and wherein said means for offsetting the potential at the second output connection of the differential-input-differential-output amplifier from the base potential of said second transistor essentially consists of a pair of semiconductor diode means serially connected from that second output connection to the base electrode of said second transistor and poled for forward conduction of output current through that second output connection.

14. A combination as set forth in claim 13 wherein said means for applying a biasing potential consists of means for applying a potential four times as large as the emitter-to-base offset potential of said sixth transistor between the emitter electrode of said second transistor and the collector electrode of said first transistor.

15. A combination as set forth in claim 10 wherein the common and output electrodes of each of said third and fourth transistors defines the ends of its respective principal current conduction path, the conductance of which principal current conduction path is controlled by potential applied between the common and input electrodes of that transistor, said combination having:

means for connecting said third and fourth transistors in long-tailed-pair configuration within said differential-input-differential-output amplifier including means for applying a tail current to an interconnection of their common electrodes for apportionment between their respective principal current conduction paths to their respective first output electrodes as controlled by the differential-mode component of or difference between input potential received at their respective input electrodes; and means for generating said tail current in proportion to the quiescent collector current level in the output circuit of said further amplifier circuitry divided by the current gain between the input and output circuits of said further amplifier circuitry.

16. A combination as set forth in claim 10, wherein the input electrode and each output electrode of each of said third and fourth transistors defines a respective one of its principal current conduction paths, the conduction of each of which principal current conduction paths is controlled by the potential applied between the input and common electrodes of that transistor, said combination having:

means connecting said third transistor in a first current mirror amplifier configuration with an output circuit that includes the path between the input and first output electrodes of said third transistor and an input circuit that includes the path between the input and common electrodes of said third transistor;

means connecting said fourth transistor in a second current mirror amplifier configuration with an output circuit that includes the path between the input and first output electrodes of said fourth transistor and with an input circuit that includes the path between the input and common electrodes of said fourth transistor; and means for generating bias currents applied to the input circuits of said first and second current mirror amplifier configurations, each of which bias currents are in proportion to the quiescent collector current level in the output circuit of said further amplifier circuitry divided by the current gain between the input and output circuits of said further amplifier circuitry.

17. In combination:

a point of reference potential;
a point of bias potential;
a point of operating potential;
first, second and third nodes;
means for supplying first and second currents at said first node and at said second node, respectively, said first and second currents being essentially unidirectional currents with equal respective common-mode components of like polarity and with equal respective differential-mode components of opposite polarity;

a balanced-to-single-ended converter connected to differentially combine the first and second currents supplied at first and second nodes, including first and second transistors of the same conductivity type, having respective base electrodes to which said first and second nodes respectively connect, for respectively receiving said first current and said second current, having respective emitter electrodes respectively connected to said third node and to said point of reference potential, having respective collector electrodes respectively connected to said point of bias potential and to said third node, and exhibiting substantially equal base-to-collector current gains, said first transistor thereby providing a current gain between said first and third nodes which substantially equals one plus the current gain concurrently provided between said second and third nodes by said second transistor;

a third transistor of the same conductivity type as said first and second transistors having a base electrode to which the voltage at said third node is applied without translation, having a collector electrode reverse-biased respective to its base electrode, and having an emitter electrode providing by emitter-follower action an offset voltage response to the voltage at said third node;

a fourth transistor of the same conductivity type as said first and second transistors having an emitter electrode connected without substantial voltage offset to said point of reference potential, having a base electrode to which the emitter voltage of said third transistor is applied without translation, and having a collector electrode; and collector load means to which the collector electrode of said fourth transistor connects, having a path for direct current therethrough connecting the collector electrode of said fourth transistor and said point of operating potential.

18. A combination as set forth in claim 17 with said balanced-to-single-ended signal converter also including:

a direct connection without substantial intervening impedance of said first node to the base electrode of said first transistor; and potential offsetting means between said second node and the base electrode of said second transistor responsive to the quiescent level of said second current to offset the potential at said second node from that at the base electrode of said second transistor an amount substantially equal to the sum of the quiescent emitter-to-base offset potentials of said third and fourth transistors, for making the quiescent levels of potential at said first and second nodes substantially equal when said first and second currents are at their quiescent levels.

19. A combination as set forth in claim 17 or 18 including:

means for regulating the difference between said reference and bias potentials to a value twice the sum of the quiescent emitter-to-base offset potentials of said third and fourth transistors.

20. In combination:
a point of reference potential;
a point of bias potential;
a point of operating potential;
first, second and third nodes;

means for supplying first and second currents at said first node and at said second node, respectively, said first and second currents being essentially unidirectional currents with equal respective common-mode components of like polarity and with equal respective differential-mode components of opposite polarity;

a balanced-to-single-ended converter connected to differentially combine the first and second currents supplied at first and second nodes, including first and second transistors of the same conductivity type, having respective base electrodes to which said first and second nodes respectively connect, for respectively receiving said first current and said second current, havng respective emitter electrodes respectively connected to said third node and to said point of reference potential, having respective collector electrodes respectively connected to said point of bias potential and to said third node, and exhibiting substantially equal base-to-collector current gains, said first transistor thereby providing a current gain between said first and third nodes which substantially equals one plus the current gain concurrently provided between said second and third nodes by said second transistor.

a third transistor of the same conductivity type as said first and second transistors having a base electrode connected without substantial voltage offset to said point of bias potential, having an emitter electrode to which the voltage at said third node is applied without substantial translation, and having a collector electrode;

means for regulating the difference between said reference and bias potentials to a value essentially twice the quiescent emitter-to-base offset potential of said third transistor; and collector load means to which the collector electrode of said third transistor connects, having a path for direct current therethrough connecting the collector electrode of said third transistor and said point of operating potential.

21. A combination as set forth in claim 20 with said balanced-to-single-ended signal converter also including:

a direct connection without substantial intervening impedance of said first node to the base electrode of said first transistor; and potential offsetting means between said second node and the base electrode of said second transistor responsive to the quiescent level of said second current to offset the potential at said second node from that at the base electrode of said second transistor an amount substantially equal to the quiescent emitter-to-base offset potential of said third transistor, for making the quiescent levels of potential at said first and second nodes substantially equal when said first and second currents are at their quiescent levels.

22. In combination:
a point of reference potential;
a point of bias potential;
a point of operating potential;
first, second and third nodes;

means for supplying first and second currents at said first node and at said second node, respectively, said first and second currents being essentially unidirectional currents with equal respective common-mode components of like polarity and with equal respective differential-mode components of opposite polarity;

a balanced-to-single-ended converter connected to differentially combine the first and second currents supplied at first and second nodes, including first and second transistors of the same conductivity type, having respective base electrodes to which said first and second nodes respectively connect, for respectively receiving said first current and said second current, having respective emitter electrodes respectively connected to said third node and to said point of reference potential, having respective collector electrodes respectively connected to said point of bias potential and to said third node, and exhibiting substantially equal base-to-collector current gains, said first transistor thereby providing a current gain between said first and third nodes which substantially equals one plus the current gain concurrently provided between said second and third nodes by said second transistor;

a third transistor of the same conductivity type as said first and second transistors having a base electrode connected without substantial voltage offset to said point of bias potential, having an emitter electrode providing by emitter-follower action an offset voltage response to said bias potential applied to its base electrode, and having a collector electrode reverse-biased respective to its base electrode;

a fourth transistor of the same conductivity type as said first, second and third transistors having an emitter electrode to which the voltage at said third node is applied without substantial translation, having a base electrode to which the emitter voltage of said third transistor is applied without substantial translation, and having a collector electrode;

means for regulating the difference between said reference and bias potentials to a value twice the sum of the quiescent emitter-to-base offset potentials of said third and fourth transistors; and collector load means to which the collector electrode of said fourth transistor connects, having a path for direct current therethrough connecting the collector electrode of said fourth transistor and said point of operating potential.

23. A combination as set forth in claim 22 with said balanced-to-single-ended signal converter also including:

a direct connection without substantial intervening impedance of said first node to the base electrode of said first transistor; and potential offsetting means between said second node and the base electrode of said second transistor responsive to the quiescent level of said second current to offset the potential at said second node from that at the base electrode of said second transistor an amount substantially equal to the sum of the quiescent emitter-to-base offset potentials of said third and fourth transistors, for making the quiescent levels of potential at said first and second nodes substantially equal when said first and second currents are at their quiescent levels.

24. A balanced-to-single-ended converter connected to differentially combine first and second currents supplied at first and second nodes, respectively, by first and second constant current generating means, for obtaining a third current that is applied by direct coupling via a third node to the input connection of an ensuing transistor amplifier, said balanced-to-single-ended signal converter comprising:

first and second transistors of the same conductivity type, having respective base electrodes to which said first and second nodes respectively connect, for respectively receiving said first current and said second current, having respective emitter electrodes respectively connected to said third node and to a point of reference potential, having respective collector electrodes respectively connected to a point of bias potential and to said third node, and exhibiting substantially equal base-to-collector current gains;

means for regulating the difference between said reference and bias potentials to a value twice the quiescent potential maintained between said point of reference potential and said third node by said direct coupling to the input connection of said ensuing transistor amplifier;

a potentiometer with a resistive body between first and second end connections and with an adjustable tap connection galvanically connected to said third node;

means for applying said reference potential to the first end connection of said potentiometer; and means for applying said bias potential to the second end connection of said potentiometer.

25. A balanced-to-single-ended signal converter as set forth in claim 24 including:

a direct connection without substantial intervening impedance of said first node to the base electrode of said first transistor; and potential offsetting means between said second node and the base electrode of said second transistor responsive to the quiescent level of said second current to offset the potential at said second node from that at the base electrode of said second transistor an amount substantially equal to the quiescent potential maintained between said point of reference potential and said third node by said direct coupling to the input connection of said ensuing transistor amplifier, for making the quiescent levels of potential at said first and second nodes equal when said first and second currents are at their quiescent levels.

* * * * *